United States Patent
Lee et al.

(10) Patent No.: US 8,828,760 B2
(45) Date of Patent: Sep. 9, 2014

(54) METHOD OF FABRICATING ORGANIC LIGHT EMITTING DEVICE

(71) Applicant: Electronics and Telecommunications Research Institute, Daejeon (KR)

(72) Inventors: Bong Joon Lee, Chungcheongbuk-do (KR); Doo-Hee Cho, Daejeon (KR); Jaehyun Moon, Daejeon (KR); Jeong Ik Lee, Gyeonggi-do (KR); Hye Yong Chu, Daejeon (KR); Seung Koo Park, Daejeon (KR); Jin Wook Shin, Incheon (KR); Jin Woo Huh, Daejeon (KR); Nam Sung Cho, Daejeon (KR); Joon Tae Ahn, Daejeon (KR); Jun-Han Han, Daejeon (KR); Chul Woong Joo, Seoul (KR); Joo Hyun Hwang, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 13 days.

(21) Appl. No.: 13/746,757

(22) Filed: Jan. 22, 2013

(65) Prior Publication Data

US 2014/0030830 A1 Jan. 30, 2014

(30) Foreign Application Priority Data

Jul. 30, 2012 (KR) .................. 10-2012-0083399

(51) Int. Cl.
*H01L 21/00* (2006.01)

(52) U.S. Cl.
USPC .............................................. 438/32; 438/29

(58) Field of Classification Search
USPC .................... 438/32, 22, 29, 31
See application file for complete search history.

(56) References Cited

U.S. PATENT DOCUMENTS

| 5,089,361 | A  | * | 2/1992  | Huang           | 430/5   |
|-----------|----|---|---------|-----------------|---------|
| 7,083,903 | B2 | * | 8/2006  | Edelberg et al. | 430/329 |
| 2005/0046339 | A1 | * | 3/2005 | Ju et al.       | 313/504 |
| 2009/0075185 | A1 | * | 3/2009 | Okubo et al.    | 430/5   |
| 2010/0308496 | A1 | * | 12/2010 | Uchida         | 264/220 |
| 2011/0266577 | A1 | * | 11/2011 | Kim et al.     | 257/98  |

FOREIGN PATENT DOCUMENTS

| JP | 10-172756 A | 6/1998 |
| KR | 10-2005-0012691 A | 2/2005 |
| KR | 10-0636579 B1 | 10/2006 |

(Continued)

OTHER PUBLICATIONS

G. Gu et al., "High-external-quantum-efficiency organic light-emitting devices", Optics Letters, Mar. 15, 1997, pp. 396-398, vol. 22, No. 6.

*Primary Examiner* — Reema Patel
(74) *Attorney, Agent, or Firm* — Rabin & Berdo P.C.

(57) ABSTRACT

Provided is a method of fabricating an organic light emitting device that may form a light scattering layer having an irregular random structure at a low temperature. The method includes providing a substrate coated with a precursor layer; sequentially forming a metal layer and an organic layer on the precursor layer; performing a heat treatment of the organic layer to form an organic mask from the organic layer; patterning the metal layer by using the organic mask to form a metal mask; patterning the precursor layer by using the metal mask to form a light scattering layer having an irregular random structure; removing the metal mask and the organic mask; and sequentially stacking a planarization layer, a first electrode, an organic light emitting layer, a second electrode, and a passivation layer on the light scattering layer.

9 Claims, 6 Drawing Sheets

(56) References Cited

FOREIGN PATENT DOCUMENTS

| | | | |
|---|---|---|---|
| KR | 10-2007-0102947 | A | 10/2007 |
| KR | 10-0914029 | B1 | 8/2009 |
| KR | 10-1000120 | B1 | 12/2010 |
| KR | 10-1081499 | B1 | 11/2011 |
| KR | 2-0001712 | A | 1/2012 |
| KR | 10-2012-0000402 | A | 1/2012 |
| KR | 10-1213487 | B1 | 12/2012 |

* cited by examiner

METHOD OF FABRICATING ORGANIC LIGHT EMITTING DEVICE

CROSS-REFERENCE TO RELATED APPLICATIONS

This U.S. non-provisional patent application claims priority under 35 U.S.C. §119 of Korean Patent Application No. 10-2012-0083399, filed on Jul. 30, 2012, the entire contents of which are hereby incorporated by reference.

BACKGROUND OF THE INVENTION

The present invention disclosed herein relates to a method of fabricating a light emitting device, and more particularly, to a method of fabricating an organic light emitting device.

An organic light emitting device (OLED) is a self-emissive device that emits light by electrically exciting an organic light emitting material. OLEDs may emit various colors according to the type of a material constituting an organic light emitting layer. OLEDs have superior display characteristics, such as wide viewing angle, fast response velocity, slimness, low fabrication cost, high contrast, and the like. OLEDs are in the limelight as next generation flat panel display devices and lighting. However, OLEDs that are available at the present have limitations that the external luminous efficiency is very low (i.e., 20% or less).

SUMMARY OF THE INVENTION

The present invention provides a method of fabricating an organic light emitting device including a light scattering part having an irregular random structure caused by dewetting at a low temperature.

Embodiments of the present invention provide methods of fabricating an organic light emitting device, including providing a substrate coated with a precursor layer, sequentially forming a metal layer and an organic layer on the precursor layer, performing a heat treatment of the organic layer to form an organic mask from the organic layer, patterning the metal layer by using the organic mask to form a metal mask, patterning the precursor layer by using the metal mask to form a light scattering layer having an irregular random structure, removing the metal mask and the organic mask, and sequentially stacking a planarization layer, a first electrode, an organic light emitting layer, a second electrode, and a passivation layer on the light scattering layer.

In some embodiments, the light scattering layer may include at least one of $SiO_2$, $SnO_2$, $TiO_2$, $TiO_2$—$SiO_2$, $ZrO_2$, $Al_2O_3$, $HfO_2$, $In_2O_3$, ITO, silicon nitride (SiNx), polyethylene-based resin, polyacrylic-based resin, polyvinylchloride (PVC) resin, polyvinylpyrrolidone resin, polyimide-based resin, polystyrene-based resin, and epoxy-based resin.

In other embodiments, the organic layer may include at least one selected from the group consisting of polystyrene, polyethylene, polyacrylate, lead, and tin.

In still other embodiments, the forming of the organic mask may include performing a heat treatment at a temperature ranging from room temperature to 250° C.

In even other embodiments, the forming of the organic mask may be performed by dewetting of the organic layer.

In yet other embodiments, the organic mask may include a pattern having an irregular shape, size or arrangement.

In further embodiments, the metal layer may have a thickness ranging from 10 nm to 100 nm.

In still further embodiments, the metal layer may include at least one of platinum, gold, silver, copper, nickel, chromium, tungsten, zinc, tin, titanium, zirconium, aluminum, poly(methyl methacrylate) (PMMA), poly(dimethylglutarimide) (PMGI), SU-8, and/or aluminum oxide ($Al_2O_3$).

In even further embodiments, the forming of the metal mask may include forming a pattern having an irregular size and arrangement in the metal layer.

In yet further embodiments, the forming of the metal mask may include etching the metal layer by using nitric acid, hydrofluoric acid, or buffered oxide etchant (BOE).

In much further embodiments, the forming of the light scattering layer may include etching the precursor layer by a reactive ion etching (RIE), and/or an inductively coupled plasma (ICP).

BRIEF DESCRIPTION OF THE DRAWINGS

For more complete understanding and help of the present invention, reference will now be made to the following detailed description of preferred embodiments taken in conjunction with the following accompanying drawings, and reference numerals are also shown below, in the drawings.

DETAILED DESCRIPTION OF PREFERRED EMBODIMENTS

Figure 1:
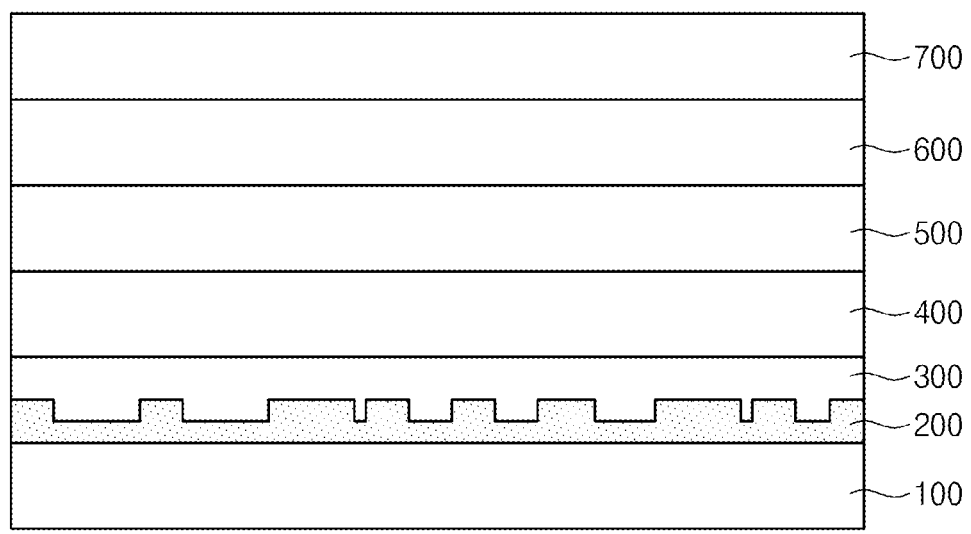
FIG. 1 is a sectional view illustrating an organic light emitting device according to an embodiment of the present invention.

To more fully understand the constitution and effect of the present invention, preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Those skilled in the art would understand that the inventive concept could be applied for a suitable environment.

In the following description, the technical terms are used only for explaining a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

It will also be understood that when a layer (or film) is referred to as being 'on' another layer or substrate, it can be directly on the other layer or substrate, or intervening layers may also be present.

It will be understood that although the terms first, second and third are used herein to describe various elements, these elements should not be limited by these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. Like reference numerals refer to like elements throughout.

The terms used in embodiments of the present invention will be construed to have meanings generally known to those skilled in the art as long as defined otherwise.

Hereinafter, it will be described about an exemplary embodiment of the present invention in conjunction with the accompanying drawings.

FIG. 1 is a sectional view illustrating an organic light emitting device according to an embodiment of the present invention.

Referring to FIG. 1, an organic light emitting device 1 may include a light scattering layer 200 having an irregular random structure, a planarization layer 300, a first electrode 400, an organic light emitting layer 500, a second electrode 600, and/or a passivation layer 700 on a substrate 100.

The substrate 100 may transmit light therethrough. The substrate 100 may be an inorganic substrate. For example, the substrate 100 may include at least one of glass, silicon oxide ($SiO_2$), and/or silicon nitride (SiN). The substrate 100 may be an organic substrate. For example, the substrate 100 may include at least one of polyimide, polyethylene terephthalate (PET), and/or polyacrylate. The substrate 100 including silicon oxide ($SiO_2$) may have a refractive index ranging from about 1.4 to about 1.5.

The light scattering layer 200 may be provided on the substrate 100. The light scattering layer 200 may include at least one of transparent materials. For example, the light scattering layer 200 may include at least one of oxides such as $SiO_2$, $SnO_2$, $TiO_2$, $TiO_2$—$SiO_2$, $ZrO_2$, $Al_2O_3$, $HfO_2$, $In_2O_3$, ITO, etc., nitrides such as silicon nitride (SiNx) etc., and resins such as polyethylene-based resin, polyacrylic-based resin, polyvinylchloride (PVC) resin, polyvinylpyrrolidone resin, polyimide-based resin, polystyrene-based resin, epoxy-based resin, etc.

The light scattering layer 200 may include an irregular random structure. The irregular random structure of the light scattering layer 200 may have an irregular shape, size, and/or arrangement. The irregular random structure of the light scattering layer 200 may have various shapes, such as a circular shape, an elliptical shape, a polygonal shape, or the like. The irregular random structure of the light scattering layer 200 may have an average size ranging from about 100 nm to about 1000 nm. The light scattering layer 200 may have a thickness ranging from about 10 nm to about 1000 nm. The average size and/or the average thickness may be adjusted. The shape and/or arrangement of the light scattering layer 200 may be also adjusted.

The light scattering layer 200 may enhance the internal light extraction efficiency of the organic light emitting device 1. The light generated in the organic light emitting layer 500 is partially or totally reflected by the substrate 100 and then is guided into insides of the first electrode 400 and the organic light emitting layer 500. The guided light may be not emitted to the substrate 100. The guided light may be approximately 45% of the total luminous amount of the organic light emitting layer 500. The irregular random structure of the light scattering layer 200 may act as a light scattering element. Light is scattered, irregularly reflected, refracted, and/or diffracted, and thus may be emitted not to the inside of the first electrode 400 but to the substrate 100. Therefore, the proportion of the light emitted to the outside from the substrate 100 to the light reflected to the inside of the first electrode 400 may be increased. The light scattering layer 200 including a regular pattern may have a light extraction effect only with respect to a specific wavelength of light. Since the irregular random structure of the light scattering layer 200 has an irregular shape, size (height, diameter), and/or arrangement, the light scattering layer 200 may scatter, irregularly reflect, refract, and/or diffract the entire light of a visible ray band without dependence on a specific wavelength. Thus, the light extraction efficiency of the organic light emitting device 1 may be enhanced. A white light organic light emitting device may have a luminance higher than other light emitting devices. A white light organic light emitting device may require a high light extraction efficiency. The light scattering layer 200 may be effective in enhancing the white light extraction efficiency.

The planarization layer 300 may cover the light scattering layer 200. The planarization layer 300 may include a transparent material. The planarization layer 300 may be formed of a material having a high refractive index. The planarization layer 300 may be formed of an inorganic material, a polymer material, and/or a complex thereof. The inorganic material may include at least of $TiO_2$, $ZrO_2$, ZnS, $TiO_2$—$SiO_2$, $SnO_2$, and $In_2O_3$. The polymer material may include at least one of polyvinyl phenol resin, epoxy resin, polyimide resin, polystyrene resin, polycarbonate resin, polyethylene resin, poly (methyl methacrylate) (PMMA) resin, and polypropylene resin. The planarization layer 300 may have a refractive index that is similar to or higher than the refractive index of the first electrode 400. For example, the planarization layer 300 may have a refractive index ranging from about 1.8 to about 2.5.

The planarization layer 300 may function to planarize an upper surface of the light scattering layer 200. The planarization layer 300 may protect the irregular random structure of the light scattering layer 200. The organic light emitting device 1 may be a few hundred nanometers thick. The planarization layer 300 may provide a flat surface having a surface roughness of a few nm or less. Thus, the organic light emitting device 1 including the light scattering layer 200 may not be lowered in electrical characteristics, compared with organic light emitting devices no including the light scattering layer 200.

The first electrode 400 may be provided on the planarization layer 300. The first electrode 400 may be an anode electrode. The first electrode 400 may be applied with an external voltage and then supply holes to the organic light emitting layer 500. The first electrode 400 may transmit light. The first electrode 400 may include a transparent conductive oxide (TCO). For example, the first electrode 400 may be formed of zinc oxide (ZnO), tin oxide ($SnO_2$), indium tin oxide (ITO), aluminium-doped zinc oxide (ZnO:Al), boron-doped zinc oxide (ZnO:B), and/or aluminum-doped zinc oxide (AZO: Aluminum Zinc Oxide). The refractive index of the first electrode 400 may be higher than that of the substrate 100. The first electrode may have a refractive index ranging from about 1.6 to about 1.9. For example, the first electrode 400 including an indium tin oxide may have a refractive index of about 1.8.

The organic light emitting layer 500 may be provided on the first electrode 400. The organic light emitting layer 500 may generate light through recombination of holes supplied from the first electrode 400 and electrons supplied from the second electrode 600. The organic light emitting layer 500 a single layer structure or a multilayer structure including an auxiliary layer. The organic light emitting layer 500 may further include an auxiliary layer enhancing the luminous efficiency. The auxiliary layer may include at least one of a hole injecting layer, a hole transfer layer, an electron transfer layer, and an electron injecting layer.

The organic light emitting layer 500 may include at least one of organic light emitting materials. For example, the organic light emitting layer 500 may include at least one of polyfluorene derivative, (poly)paraphenylenevinylene derivative, polyphenylene derivative, polyvinylcarbazole derivative, polythiophene derivative, anthracene derivative, butadiene derivative, tetracene derivative, distyrylarylene derivative, benzazole derivative and carbazole. According to embodiments, the organic light emitting layer 500 may further include a dopant in the organic light emitting material. The dopant may include at least one selected from the group consisting of xanthene, perylene, cumarine, rhodamine, rubrene, dicyanomethylenepyran, thiopyran, (thia)pyrilium, periflanthene derivative, indenoperylene derivative, carbostyryl, nile red, and/or quinacridone. The organic light emitting layer 500 may have a refractive index ranging from about 1.6 to about 1.9. For example, the organic light emitting layer 500 may have a refractive index of about 1.75.

The second electrode 600 may be provided on the organic light emitting layer 500. The second electrode 600 may be a cathode. The second electrode 600 may be applied with an external voltage and supply electrons to the organic light emitting layer 500. The second electrode 600 may include a conductive material. The second electrode 600 may include a material having a work function lower than that of the first electrode 400. For example, the second electrode 600 may include at least one of aluminum (Al), silver (Ag), magnesium (Mg), molybdenum (Mo), and alloys thereof. The second electrode 600 may reflect the light generated in the organic light emitting layer 500 toward the first electrode 400.

The passivation layer 700 may be provided on the second electrode 600. The passivation layer 700 may be a sealed passivation layer and/or a packaged glass plate. The passivation layer 700 may be formed of an air-impermeable material. The passivation layer 700 may include a transparent material. The passivation layer 700 may protect the organic light emitting layer 500.

The organic light emitting device 1 may enhance the light extraction efficiency through a difference in refractive index between the organic light emitting layer 500, the first electrode 400 and/or the planarization layer 300. The light generated from the organic light emitting layer 500 may be incident into the first electrode 400 and the planarization layer 300 and then emitted to the outside of the organic light emitting device 1. The first electrode 400 may have a refractive index higher than the organic light emitting layer 500. According to Snell's law, when the light generated from the organic light emitting layer 500 is incident into the substrate 100, the angel of refraction of light may be smaller than the angle of the incidence of light. Therefore, it may be minimized that some of light generated from the organic light emitting layer 500 is totally reflected and thus lost. The planarization layer 300 may have a refractive index higher than the first electrode 400. It may be also minimized that light is reflected by a boundary surface between the first electrode 400 and the planarization layer 300.

A method of fabricating an organic light emitting device according to an embodiment of the present invention will now be described.

Figure 2:
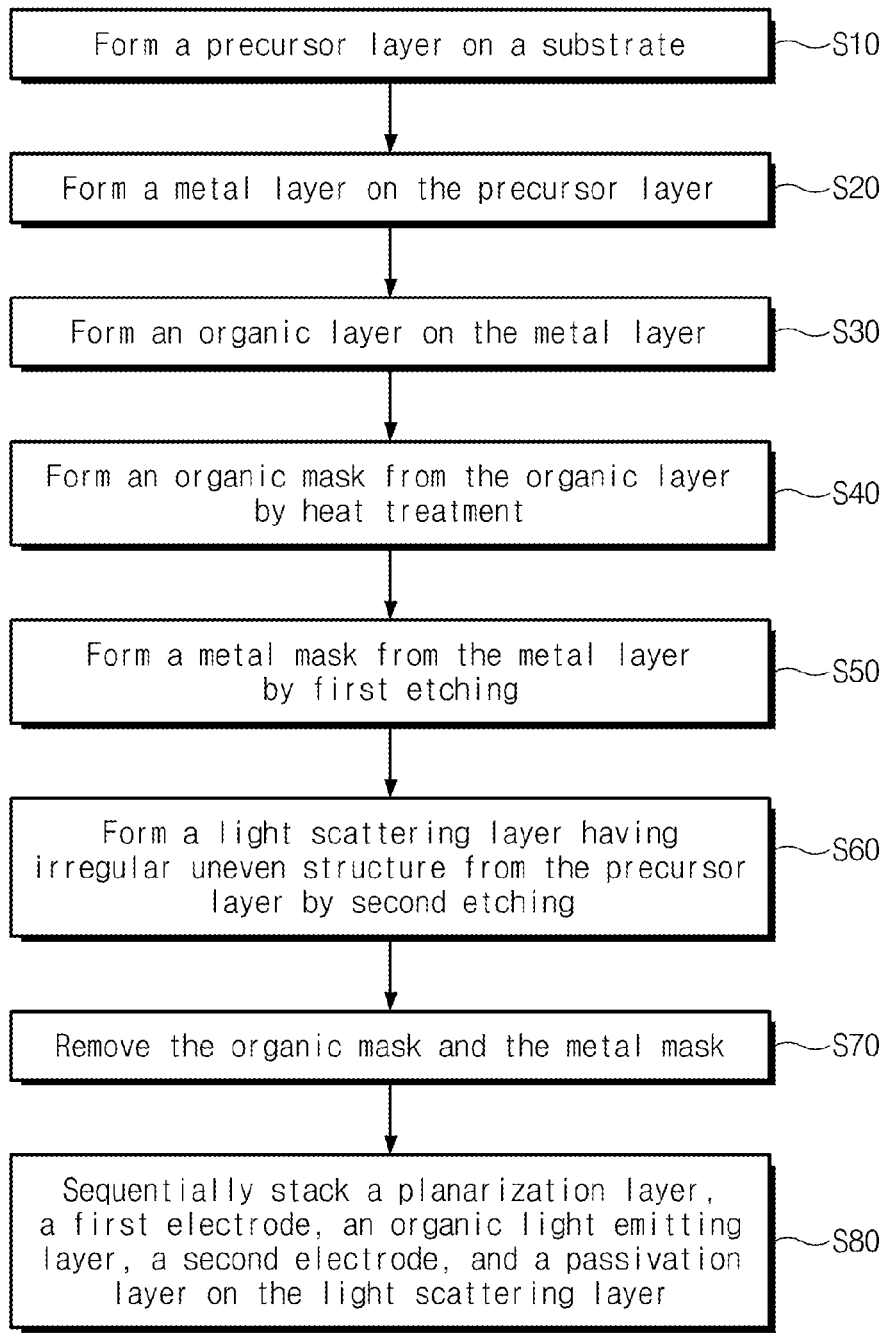
FIG. 2 is a flow diagram illustrating a method of fabricating an organic light emitting device according to an embodiment of the present invention.

FIG. 2 is a flow diagram illustrating a method of fabricating an organic light emitting device according to an embodiment of the present invention. FIGS. 3A through 3G are sectional views illustrating a method of fabricating an organic light emitting device according to an embodiment of the present invention.

Referring to FIG. 2, a method of fabricating an organic light emitting device may include forming a precursor layer 210 on a substrate 100 (S10), forming a metal layer 220 on the precursor layer 210 (S20), forming an organic layer 230 on the metal layer 220 (S30) performing a heat treatment of the organic layer 230 to form an organic mask 235 from the organic layer 230 (S40), performing a first etching to form a metal mask 225 from the metal layer 220 (S50), performing a second etching to form a light scattering layer 200 having an irregular random structure (S60), removing the metal mask 225 and the organic mask 235 (S70), and sequentially stacking a planarization layer 300, a first electrode 400, an organic light emitting layer 500, a second electrode 600, and a passivation layer 700 on the light scattering layer 200 (S80).

Figure 3A:
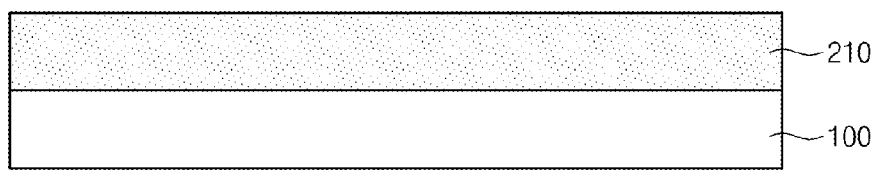
FIGS. 3A through 3G are sectional views illustrating a method of fabricating an organic light emitting device according to an embodiment of the present invention.

Referring to FIGS. 2 and 3A, the precursor layer 210 may be formed on the substrate 100 (S10). The substrate 100 may be washed prior to the forming of the precursor layer 210. The washing may be performed by using distilled water, an organic solvent, a base solution, and/or an acid solution. The precursor layer 210 may be formed by a deposition. For example, the precursor layer 210 may be formed by a chemical vapor deposition (CVD), an E-beam evaporation, a thermal evaporation, and/or an atomic layer deposition. The precursor layer 210 may include at least one of transparent materials. For example, the precursor layer 210 may include at least one of oxides (e.g., $SiO_2$, $SnO_2$, $TiO_2$, $TiO_2$—$SiO_2$, $ZrO_2$, $Al_2O_3$, $HfO_2$, $In_2O_3$, ITO, etc.), nitrides (e.g., SiNx), and resins (e.g., polyethylene-based resin, polyacrylic-based resin, polyvinylchloride (PVC) resin, polyvinylpyrrolidone resin, polyimide-based resin, polystyrene-based resin, and epoxy-based resin). The thickness of the precursor layer 210 may be adjusted. For example, the precursor layer 210 may be formed with a thickness ranging from 100 nm to 1000 nm.

Figure 3B:
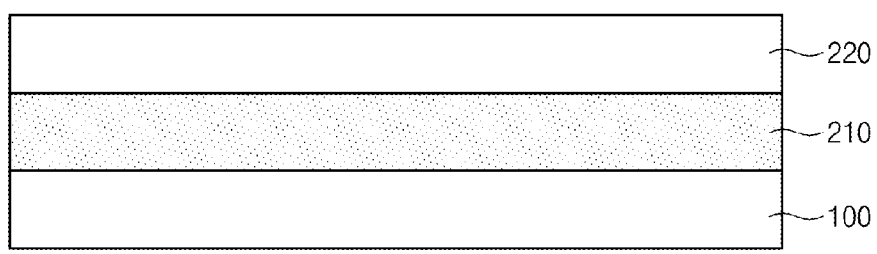

Referring to FIGS. 2 and 3B, the metal layer 220 may be formed on the precursor layer 210 (S20). The organic layer 230 may be formed by a deposition or coating. The metal layer 220 includes a material resistant to the dry etching. The metal layer 220 may include at least one of metals (e.g., Pt, Au, Ag, Co, Ni, Cr, W, Zn, Sn, Ti, Zr, Al, and/or combinations thereof), photoresists (e.g., poly(methyl methacrylate) (PMMA), poly(dimethylglutarimide) (PMGI), SU-8), ceramics (e.g., $Al_2O_3$), and/or organic compounds. If the metal layer 220 is thin, the metal layer 220 is not formed in a layer but may be deposited in the form of an island. The metal layer 220 may be formed with a thickness of a few ten nm. For example, the metal layer 220 may be formed with a thickness ranging from 10 nm to 100 nm.

Figure 3C:
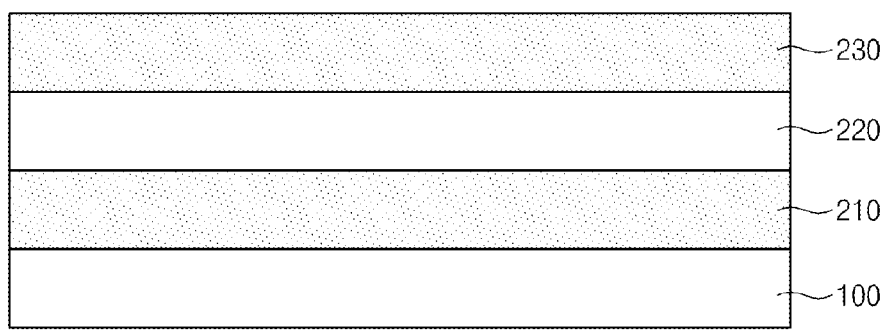

Referring to FIGS. 2 and 3C, the organic layer 230 may be formed on the metal layer 220 (S30). The organic layer 230 may be formed by a deposition and/or a coating (e.g., spin coating). The organic layer 230 may include a polymer material having a glass transition temperature (Tg) ranging from room temperature to 200 degrees Celsius. For example, the organic layer 230 may include polymers, such as polystyrene, polyethylene, and polyacrylate, and/or oligomers. The organic layer 230 may include a low melting point metal material having a melting point ranging from room temperature to 300 degrees Celsius. For example, the organic layer 230 may include lead (Pb), tin (Sn), and/or alloys thereof.

Figure 3D:
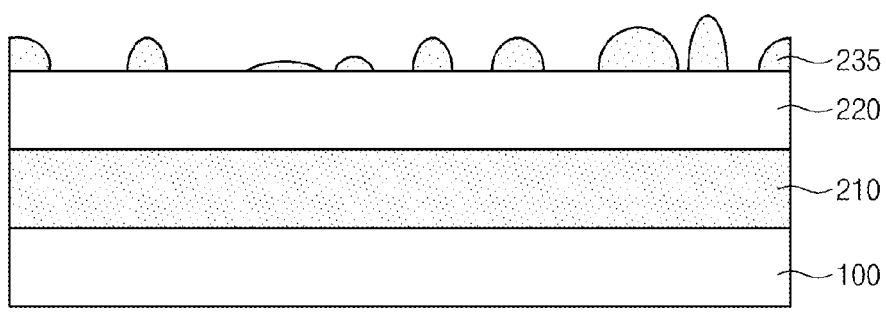

Referring to FIGS. 2 and 3D, the organic mask 235 may be formed by performing a heat treatment of the organic layer 230 of FIG. 3C (S40). The organic mask 235 having an irregular pattern may be formed by dewetting from the flat-coated organic layer 230 of FIG. 3C. The dewetting indicates that a material having a dewetting property in a film state uniformly deposited on a surface is partially dented or abruptly protruded to form an irregular pattern. The dewetting may form a hole in a film so that a substrate under the film may be exposed. By performing a heat treatment of the organic layer 230 or changing the atmosphere, dewetting occurs between the metal layer 220 and the organic layer 230 of FIG. 3C. The organic mask 235 may partially expose the metal layer 220. The heat treatment process may be performed by a thermal annealing and/or a rapid thermal annealing (RTA) using an oven and/or a hot-plate. The heat treatment process may be performed in a temperature range below a softening point of the substrate 100. For example, the heat treatment may be performed at a temperature ranging from room temperature to 250 degrees Celsius (° C.). The atmosphere of the organic layer 230 may be changed into an organic solvent vapor atmosphere or a vacuum state. The organic mask may have an irregular pattern, size, and/or arrangement. For example, the organic mask 235 may include an irregular pattern, such as a pillar shape, an elliptical shape, a capsule shape, or a hole shape. The irregular pattern of the organic mask 235 may be adjusted by controlling temperature and time of the heat treatment, atmosphere of the heat treatment, concentration of the organic solution, thickness of the organic layer 230, type of the polymer included in the organic layer 230, and/or molecular weight. The average diameter and/or average thickness of the organic mask 235 may be adjusted. For example, the organic mask 235 may have a size ranging from about 100 nm to about 1000 nm. The organic mask 235 may have a thickness ranging from about 10 nm to about 500 nm.

Figure 3E:
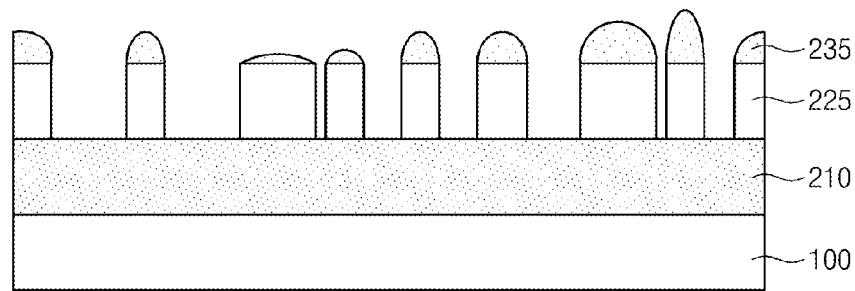

Referring to FIGS. 2 and 3E, the metal mask 225 may be formed by a first etching of the metal layer 220 of FIG. 3D (S50). The first etching may include a wet etching. For example, the first etching may be performed by using nitric acid, hydrofluoric acid, or buffered oxide etchant (BOE). The metal mask 225 may be formed by using the organic mask 235. The exposed metal layer 220 of FIG. 3D may be etched by using the organic mask 235 having an irregular pattern. Therefore, the metal mask 225 may have an irregular pattern. The metal mask 225 may partially expose the precursor layer 210. The precursor layer 210 may be not etched during the first etching.

Figure 3F:
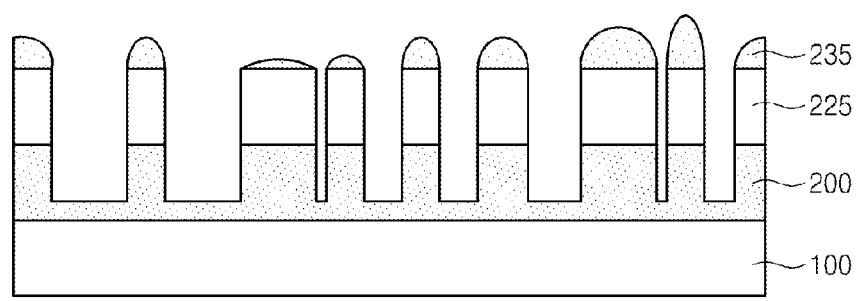

Referring to FIGS. 2 and 3F, a second etching of the precursor layer 210 of FIG. 3E may form the light scattering layer 200 having an irregular random structure (S60). The second etching may include a dry etching. For example, the second etching may be performed by using a reactive ion etching (RIE) and/or an inductively coupled plasma (ICP). The metal mask 225 may be used in the second etching. Since the metal mask 225 includes a material resistant to the dry etching, the metal mask 225 may maintain the shape of the mask during the second etching. The etching rate may be controlled by adjusting the process time, and type and proportion of a gas used in the etching. The second etching of the exposed precursor layer 210 of FIG. 3E may form the light scattering layer 200 having an irregular pattern. As an example, the light scattering layer 200 may include an irregular random structure.

Figure 3G:
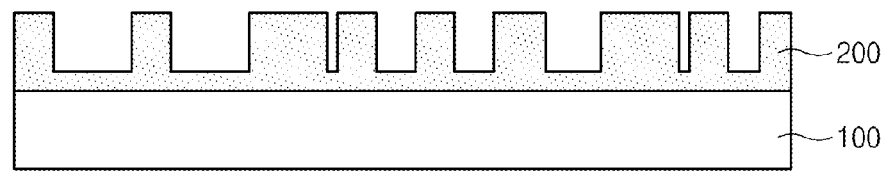

Referring to FIGS. 2 and 3G, the organic mask 235 and the metal mask 225 may be removed (S70). The organic mask 235 may be removed by using an organic solvent (e.g., acetone, toluene, etc.). The metal mask 225 may be removed by using an etchant.

Again referring to FIGS. 1 and 2, the planarization layer 300, the first electrode 400, the organic light emitting layer 500, the second electrode 600, and the passivation layer 700 may be sequentially stacked on the light scattering layer 200.

According to the embodiments of the present invention, the method of fabricating an organic light emitting device may form the light scattering layer having an irregular random structure at a low temperature. The organic mask may be inappropriate for the use of a dry etching. The metal mask may not cause the dewetting at a low temperature. Therefore, both of the organic mask and the metal mask may be used in order to form an irregular pattern in the light scattering layer. Organic light emitting devices using a plastic substrate or organic light emitting devices having a weak heat resistance, such as active matrix organic light emitting devices (AMOLEDs) may experience the performance lowering at a high temperature. According to the present invention, the method of fabricating an organic light emitting device may form the light scattering layer having an irregular random structure at a low temperature. Thus, since the light scattering layer is formed in various organic light emitting devices, the light extraction efficiency of the organic light emitting devices may be enhanced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating an organic light emitting device, comprising:
   providing a substrate;
   coating a precursor layer on the substrate;
   sequentially forming a metal layer and an organic layer in that stated order on the precursor layer;
   performing a heat treatment of the organic layer to form an irregularly patterned organic mask from the organic layer, during the heat treatment, the precursor layer, the metal layer and the organic layer are all disposed on the substrate, the heat treatment being performed at a temperature ranging from room temperature to 250 degrees Celsius so as to dewet the organic layer thereby forming the irregularly patterned organic mask;
   patterning the metal layer by using the organic mask to form a metal mask;
   patterning the precursor layer by using the metal mask to form a light scattering layer having an irregular, random structure;
   removing both of the metal mask and the organic mask; and
   sequentially stacking a planarization layer, a first electrode, an organic light emitting layer, a second electrode, and a passivation layer in that stated order on the light scattering layer.

2. The method of claim 1, wherein the light scattering layer comprises at least one material from the group of $SiO_2$, $SnO_2$, $TiO_2$, $TiO_2$—$SiO_2$, $ZrO_2$, $Al_2O_3$, $HfO_2$, $In_2O_3$, ITO, silicon nitride (SiNx), polyethylene-based resin, polyacrylic-based resin, polyvinylchloride (PVC) resin, polyvinylpyrrolidone resin, polyimide-based resin, polystyrene-based resin, and an epoxy-based resin.

3. The method of claim 1, wherein the organic layer comprises at least one material from the group of polystyrene, polyethylene, polyacrylate, lead, and tin.

4. The method of claim 1, wherein the organic mask comprises a pattern having an irregular shape, size or arrangement.

5. The method of claim 1, wherein the metal layer has a thickness ranging from 10 nm to 100 nm.

6. The method of claim 1, wherein the metal layer comprises at least one material from the group of platinum, gold, silver, copper, nickel, chromium, tungsten, zinc, tin, titanium, zirconium, aluminum, poly(methyl methacrylate) (PMMA), poly(dimethylglutarimide) (PMGI), SU-8, and aluminum oxide ($Al_2O_3$).

7. The method of claim 1, wherein the patterning the metal layer comprises forming a pattern having an irregular size and arrangement in the metal layer to form the metal mask.

8. The method of claim 1, wherein the patterning the metal layer comprises etching the metal layer to form the metal mask by using nitric acid, hydrofluoric acid, or buffered oxide etchant (BOE).

9. The method of claim 1, wherein the patterning the precursor layer comprises etching the precursor layer to form the light scattering layer by using a reactive ion etching (RIE), or an inductively coupled plasma (ICP).

* * * * *